United States Patent
Bacigalupo

(12) 
(10) Patent No.: US 6,448,812 B1
(45) Date of Patent: *Sep. 10, 2002

(54) PULL UP/PULL DOWN LOGIC FOR HOLDING A DEFINED VALUE DURING POWER DOWN MODE

(75) Inventor: Tommaso Bacigalupo, San Jose, CA (US)

(73) Assignee: Infineon Technologies North America Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/096,489

(22) Filed: Jun. 11, 1998

(51) Int. Cl.[7] .................. H03K 19/094; H03K 19/0175
(52) U.S. Cl. ............................. 326/83; 326/86; 326/87; 326/121; 326/58
(58) Field of Search .............. 326/83, 86–87, 326/57–58, 121

(56) References Cited

U.S. PATENT DOCUMENTS

| | | | | |
|---|---|---|---|---|
| 4,680,487 A | * | 7/1987 | Kobayashi | 326/86 |
| 5,063,308 A | * | 11/1991 | Borkar | 326/87 |
| 5,500,611 A | * | 3/1996 | Popat et al. | 326/87 |
| 5,517,129 A | * | 5/1996 | Matsui | 326/27 |
| 5,614,842 A | * | 3/1997 | Doke et al. | 326/58 |
| 5,852,579 A | * | 12/1998 | Arcoleo et al. | 326/87 |

* cited by examiner

Primary Examiner—Michael G. Lee
Assistant Examiner—Steven S. Paik
(74) Attorney, Agent, or Firm—Fish & Richardson P.C.

(57) ABSTRACT

A circuit and a method for setting a digital potential at an integrated circuit output pin in which pull up/pull down circuitry holds a defined value at the output pin during the power down of the integrated circuit. A primary driver responsive to a state of the integrated circuit sets the output pin while the integrated circuit is in an active mode of operation, and secondary driver sets the output pin while the integrated circuit is in an inactive mode of operation. Control logic is provided as being responsive to a change in the mode of operation of the integrated circuit from its active mode to its inactive mode for generating a control signal relative to the state of the integrated circuit. The secondary driver logic is responsive to the control signal generated by the control logic and the state of the integrated circuit upon the change in the mode of operation of the integrated circuit from a powered up mode to a powered down mode for driving the output pin while the integrated circuit is in its inactive mode of operation.

19 Claims, 2 Drawing Sheets

PULL UP/PULL DOWN LOGIC FOR HOLDING A DEFINED VALUE DURING POWER DOWN MODE

BACKGROUND OF THE INVENTION

1. Field of the Invention

The present invention relates to circuits and methods for setting a digital potential at an integrated circuit output and/or a bi-directional input/output pin, and more particularly to pull up/pull down circuitry which holds a defined value at the output and/or bi-directional input/output pin during the power down of the integrated circuit.

2. Description of the Related Art

Presently many integrated circuits (ICs) are provided with capabilities for entering a power-down mode in order to save energy during phases of inactivity. During inactive power down modes, the output and/or bi-directional input/output pins of integrated circuits should keep their defined values, otherwise other parts of the system utilizing the integrated circuits may become corrupted. For example, random access memory (RAM) contents may be modified or even lost if the IC output pins in the system connected to RAM are allowed to change state during periods of inactivity.

On the other hand, it would be useful if the values kept at the output and/or bi-directional input/output pins of inactive integrated circuits may be allowed to be overwritten by other, perhaps active IC sections of a computer system. Thus, access to a device, e.g., RAM, may be achieved using connections to the powered down integrated circuit.

In conventional microprocessors however, the output drivers keep on driving the last value which was valid prior to entering the power-down mode. Typically this value cannot be overwritten, because normally, high current capacity output drivers are used for driving the prior valid value. Accordingly, it is then necessary to switch off the output completely before entering the power-down mode. If it is desired that the signal should be used by another active device during the power down mode of the inactive device, additional software must be provided for switching off an output driver prior to power down, and additional hardware may be required to keep a defined value on a circuit output pin which has been switched off. Accordingly, it would be desirable to provide logic for use with an integrated circuit pin for holding a defined value at that pin during a power-down mode. Additionally, it would be advantageous to hold the digital potential at the integrated circuit pin at either a current or last value driven prior to a power-down.

SUMMARY OF THE INVENTION

In a described embodiment, a circuit embodying the invention sets a digital potential at an integrated circuit output and/or bi-directional input/output pin in which pull up/pull down circuitry holds a defined value. Separate primary and secondary driver circuits set the output and/or bi-directional input/output pin when the integrated circuit is in particular modes of operation. Control logic is provided as being responsive to a change in the mode of operation of the integrated circuit from its active mode to its inactive mode for generating control signals relative to the state of the integrated circuit. The control logic is connected to pull-up and pull-down transistors of the secondary driver logic for pulling up and pulling down the output and/or bi-directional input/output pin. The second driver circuit transistors are of less current-sourcing capability than the primary inverter circuit for driving the output and/or bi-directional output/input pin while the integrated circuit is in its powered down mode of operation.

Briefly summarized, the present invention relates to a circuit and a method for setting a digital potential at an integrated circuit output and/or bi-directional input/output pin in which pull up/pull down circuitry holds a defined value at the output and/or bi-directional input/output pin during the power down of the integrated circuit. A primary driver responsive to a state of the integrated circuit sets the output and/or bi-directional input/output pin while the integrated circuit is in an active mode of operation, and secondary driver sets the output and/or bi-directional input/output pin while the integrated circuit is in an inactive mode of operation. Control logic is provided as being responsive to a change in the mode of operation of the integrated circuit from its active mode to its inactive mode for generating a control signal relative to the state of the integrated circuit. The secondary driver logic is responsive to the control signal generated by the control logic and the state of the integrated circuit upon the change in the mode of operation of the integrated circuit from a powered up mode to a powered down mode for driving the output and/or bi-directional input/output pin while the integrated circuit is in its inactive mode of operation.

BRIEF DESCRIPTION OF THE DRAWINGS

Other features, objects and advantages of the present invention will become readily apparent and understood upon consideration of the following detailed description and attached drawings, wherein.

DETAILED DESCRIPTION OF THE INVENTION

Figure 1:
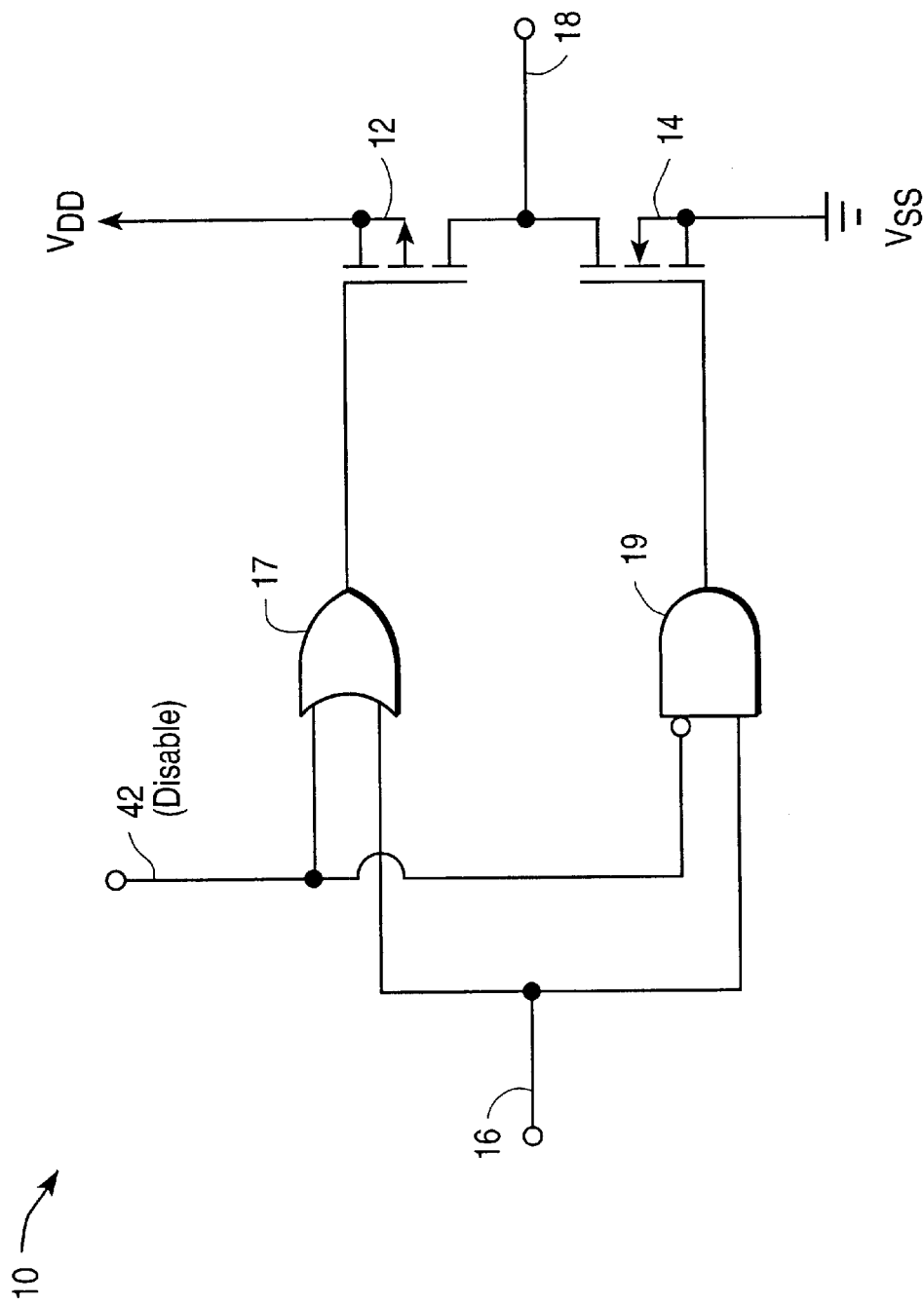
FIG. 1 is a schematic diagram showing a logic inverter circuit.

Exemplary embodiments of the invention are illustrated in the accompanying drawings relating to circuit design techniques that may be employed in integrated circuits. One embodiment for a circuit for setting a digital potential according to the present invention provides logic at an integrated circuit output and/or bi-directional input/output pin, e.g., a parallel port pin of a microcontroller, for holding a defined value at that pin during a power down mode. As depicted in FIG. 1, a CMOS inverter 10 is shown as representing a conventional logic inverter circuit, including a p-channel field effect transistor 12 and a n-channel field effect transistor 14. As discussed further below, an input signal at the inverter input 16 is thus logic inverted at output 18. An additional input logic 17 and 19 coupled to transistors 12 and 14 is connected to a power down indication signal 42 discussed below, to disable the inverter 10 during power down. The inverter 10 thus provides for inversion of a digital potential, and a buffered signal output in accordance with the current-sourcing capabilities of transistors 12 and 14.

The driver 10 is provided as a primary driver in FIG. 2, which illustrates a circuit 20 for setting a digital potential at an integrated circuit output pin 22 using pull up/pull down logic described below for holding a defined value during an inactive or power down mode in accordance with the invention. Herein, the circuit 20 sets a digital potential at an integrated circuit output pin 22 in which pull up/pull down circuitry holds a defined value. The primary driver inverter 10 is responsive to a state, e.g., digital potential values driven at output pin 22, of the integrated circuit to set the output pin 22 while the integrated circuit is in an active mode of operation.

With reference to FIG. 1, the transistors 12 and 14 of the CMOS driver 10 may be enhancement-mode MOSFET devices. The source of the transistor 12 is connected to the positive terminal of the power supply (VDD), and the source of transistor 14 is connected to the negative terminal (e.g., electrical ground) of the power supply (VSS). In the described inverter circuit configuration, the drains and the gates of transistors 12 and 14 are coupled to input 16 through logic gates 17 and 19. A single power supply is used and the circuit operates satisfactorily for power supply voltages in the range of 3 to 18 Volts.

When the driver is enabled, with the power down indication signal 42 low, and the driver input 16 low (i.e., zero volts), transistor 14 will be off and transistor 12 will be on. In the absence of an external load, the current conducted by transistor 12 will be negligibly small (in the nanoamp range) and the power dissipation will be correspondingly small. The voltage drop across transistor 12 will be very small (a few millivolts) and the output high level (VOH) will be almost equal to VDD. In this state transistor 12 (the pull-up transistor) provides a low impedance between the output terminal and the positive supply VDD.

When the driver is enabled and the driver input 16 is high (i.e., VDDvolts) transistor 14 will be on and transistor 12 will be off. The operation in this state is the complement of that described above, and the output low voltage (VOL) will be within a few millivolts of VSS. In this state the current-sinking capability of the inverter 10 is determined by the i-v characteristics of transistor 14 (the pull-down transistor). When the driver is disabled, on the other hand, the driver output 18 is not driven and floats in a high impedance state, to provide tristate capabilities.

Since the input resistances of a CMOS gate such as the described driver 10, are very high, a gate input left unconnected will float at an unknown voltage. Usually, however, leakage currents are such that the input devices enter the active mode, allowing large currents to flow and causing overheating to result. Accordingly it is important that spare gate inputs be connected to an appropriate local power supply pin or paralleled with another input (keeping in mind the effect of this on the gate-switching threshold.) As discussed, the embodiment described below provides useful output logic for setting the value of output pin 22, while allowing kept values to be overwritten to allow access to the integrated circuit during the inactive powered down mode.

Figure 2:
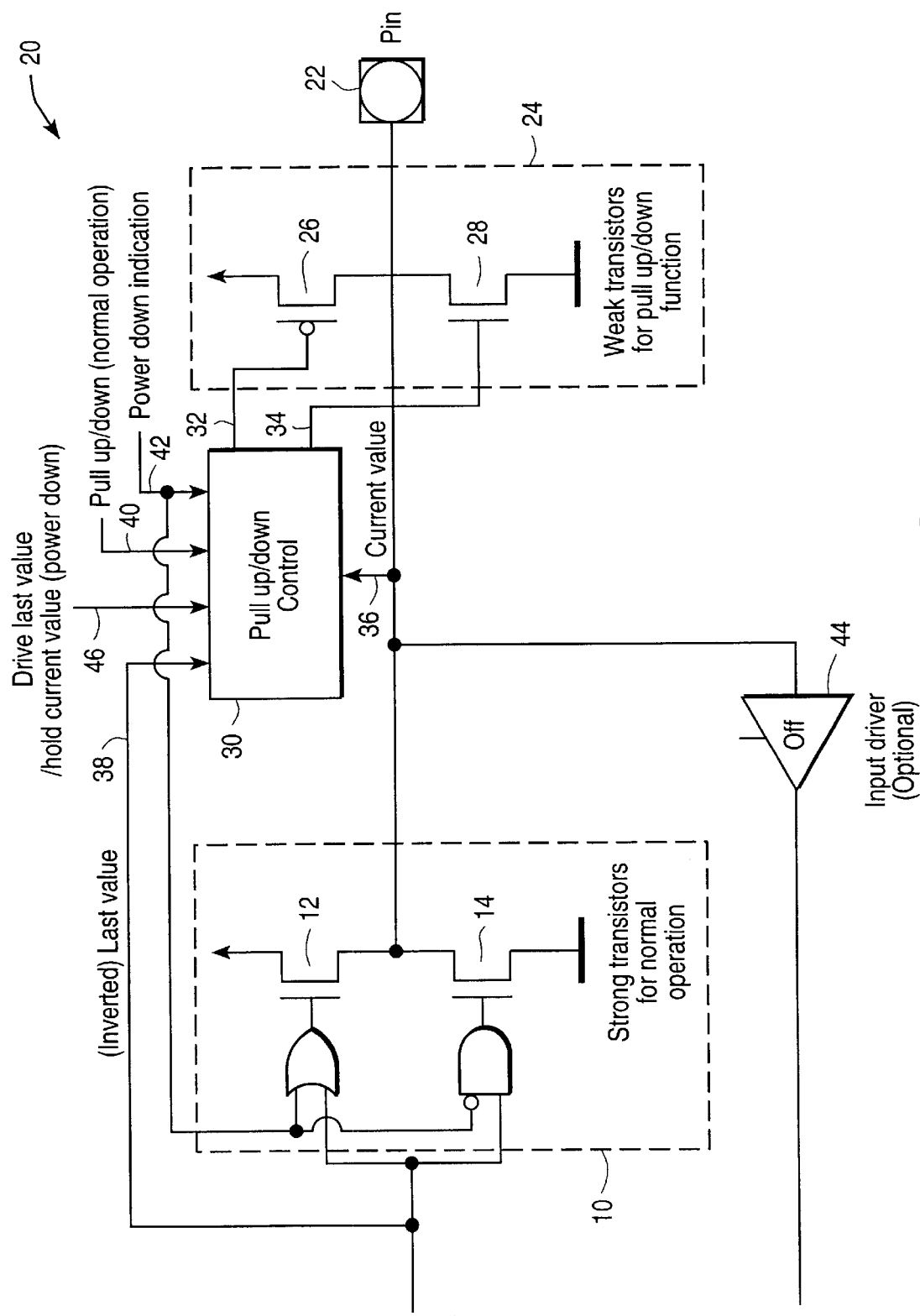
FIG. 2 illustrates pull up and pull down logic for holding a defined value during power down mode for use with primary inverter logic for driving the output pin in accordance with an embodiment of the present invention.

In FIG. 2, a secondary driver circuit 24 sets the output pin 22 while the integrated circuit is in an inactive mode of operation. The secondary driver circuit 24 has a pull-up transistor 26 and a pull-down transistor 28. The first driver circuit 10 and the second driver circuit 24 are connected together as a wired OR output at the pin 22, providing a common point for the separate circuits such that the combination of their outputs results in an OR function, i.e., the point at which the circuits are wired together will be a logic true if either circuit feeding it is at the corresponding digital potential.

Control logic 30 which may be an integrated circuit decoder or a selector circuit for controlling the transistors 26 and 28. A selector circuit embodiment of the control logic 30 is provided in which current or last values for controlling the transistors 26 and 28 are determined from inputs to the control logic 30, as discussed below. Alternatively, the control logic 30 may generate control signals under program control using a microcontroller, programmable logic or the like. The control logic 30 thus is provided as being responsive to a change in the mode of operation of the integrated circuit from its active mode to its inactive mode for generating plural control signals 32 and 34 relative to the state of the integrated circuit. The control logic 30 is connected to the pull-up transistor 26 via control line 32 and to the pull-down transistor 28 via control line 34 for pulling up or pulling down the output pin 22. The secondary driver logic 24 thus is responsive to one or more control signals 32 or 34 generated by the control logic 30. Herein, the active mode is a powered up mode of operation and the inactive mode is a powered down mode of operation of the integrated circuit respectively, with the first driver logic primary driver circuit 10 being of sufficient current-sourcing capability to drive the output pin 22 while the integrated circuit is in its powered up mode of operation. The second driver circuit logic 24 provides pull up/down functions that can be used during normal operation, and has secondary inverter circuit transistors 26 and 28 of less current-sourcing capability than the primary inverter circuit 10 for driving the output pin 22 while the integrated circuit is in its powered down mode of operation, the circuit 10 being disabled during power down. Accordingly, the primary inverter circuit 10 has relatively strong transistors 12 and 14 for the active powered up mode of operation, while the secondary inverter circuit 24 has relatively weak transistors 26 and 28 for the inactive powered down mode of operation of the integrated circuit.

The pull up/down circuit control logic 30 takes advantage of several inputs that are used for generating signals 32 and 34. In particular, the current value 36 and the (inverted) last value 38 are provided as inputs to control 30. The selector logic of the control logic 30 uses the current value 36 or the last value 38 to control transistors 26 and 28 of the secondary inverter circuit in FIG. 2. Thus, representative values of the output pin 22 being driven by the primary driver circuit 10 during the power-up mode prior to the power-down mode as the integrated circuit enters the power-down mode of operation is provided for use with the control logic 30 receiving such values for generating the control signal relative to the state of the integrated circuit. In particular, the representative current value 36 and last value 38 may be used selectively depending on the mode of operation of the control 30. Herein, a pull-up/down (normal operation) mode indication 40 provides for the control 30 signal operating relative to the state of the integrated circuit, and further the mode indication 40 serves to enable and disable the controlling of the pull-up transistor 26 and the pull-down transistor 28 for driving the output pin 22. As indicated in the table below, the mode of the integrated circuit may be selected with the selector circuit for operation in a normal mode of operation wherein user has the choice of having a pull-up or pull-down function, or the power-down mode may be provided as either pulling to the current value 36 or alternatively the last value 38.

| Mode of IC | Pull Up/Down Mode | Description |
|---|---|---|
| Normal operation | Pull up or down or turned off depending on the control signals "pull up/down" (Enabled or disabled in control logic 30) | The user has the choice of having a pull up or pull down function or to disable it. |

-continued

| Mode of IC | Pull Up/Down Mode | Description |
|---|---|---|
| Power down | Pull to current value or pull to last value. | The current value of the pin will be driven by the pull up/down logic. |
| | Selected by control logic 30 | The last value before entering power down will be driven by the pull up/down logic. |

The power-down indication 42 provides a signal representative of the system state of the integrated circuit for the control 30. An input signal 46 to the control 30, provides the function of selecting during the last value or holding the current value during power down. Accordingly, the control 30 receives the signal indication representative of a power-down status for the system during the power-up mode prior to the power-down mode, which indication is used by the control logic 30 receiving the power-down indication 42 for generating the control signal relative to the state of the integrated circuit. An input driver 44, optionally employed with bi-directional input/output integrated circuit pads is shown in schematic form, also is coupled to pin 22 for receiving digital signals received at the integrated circuit.

The control logic 30 is provided as selector control logic described in a logic table, as follows:

| Signal | Level | Condition |
|---|---|---|
| 32 | low | (normal_operation AND pullup_function = true) OR (power_down AND drive_last_value = true AND inverted_last_value = low) OR (power_down AND hold_current_value = true AND current_value = high) |
| 32 | high | otherwise |
| 34 | high | (normal_operation AND pulldown_function = true) OR (power_down AND drive_last_value = true AND inverted_last_value = high) OR (power_down AND hold_current_value = true AND current_value = low) |
| 34 | low | otherwise |

As discussed, the pull-up/down control 30 controls the operation of the weak pull-up/down transistors 26 and 28, such that the control 30 provides operation in accordance with the above described pull-up/down operation mode, or a combination of such modes of operation for use in the inactive power-down state of the integrated circuit. The pull-up/pull-down logic for holding the defined value during the power down mode may be used for microprocessors or other integrated circuits such as the Siemens C167 microprocessor output drivers keeping the last driven value active. The described pull-up/down transistors 26 and 28 may be provided as any pull-up/down elements such as a combination of switchable elements with a resistor depending upon the technology employed, e.g., BICMOS, CMOS, NMOS and the like.

Thus the described logic provides for a weak driver for a BUS HOLD function which may be responsive to external events to the integrated circuit device, such as setting the output pin 22 logic level with a second driver logic active device connected to the bus for generating control signals allowing the output pin 22 logic level to be overwritten by such external devices upon power-down of the integrated circuit. Thus a method for setting a digital potential at an integrated circuit device output pin 22 is described using the steps of driving output pin 22 with first driver logic responsive to a state of the integrated circuit when the integrated circuit is in its active mode of operation, driving the bi-directional input/output pin with second driver logic when the integrated circuit is in an inactive mode of operation, generating a control signal relative to the state of the integrated circuit in response to a change in the mode of operation of the integrated circuit from the active mode to the inactive mode, and then setting the output pin logic level with the second driver logic in response to the generated control signal and the state of the integrated circuit while the integrated circuit is in the inactive mode of operation.

The control signal generating step of the described method may further be used to generate control signals in response to an event external to the integrated circuit device, allowing the output pin logic level to be overwritten by external devices upon power down of the integrated circuit device.

What is claimed is:

1. A circuit for setting a digital potential at an integrated circuit output pin, comprising:

first driver logic responsive to a state of the integrated circuit for driving the output pin while the integrated circuit is in an active mode of operation;

second driver logic for driving the output pin while the integrated circuit is in a power-down mode of operation during a phase of inactivity; and control logic responsive to a change in the mode of operation of the integrated circuit from the active mode to the power-down mode for generating a control signal relative to the state of the integrated circuit;

the second driver logic being coupled to receive and responsive to the control signal generated by the control logic and the state of the integrated circuit upon the change in the mode of operation of the integrated circuit from the active mode to the power-down mode for selectively driving the output pin while the integrated circuit is in the power-down mode of operation;

wherein the first driver logic comprises a primary driver circuit with tristate capability of sufficient current-sourcing capability to drive the output pin while the integrated circuit is in the active mode of operation; and the second driver logic comprises a secondary driver circuit of less current-sourcing capability than the primary driver circuit for selectively driving the output pin while the integrated circuit is in the powder-down mode of operation.

2. A circuit as recited in claim 1, wherein the output pin comprises a bi-directional input/output integrated circuit pin.

3. A circuit as recited in claim 1, wherein the first driver circuit and the second driver circuit are connected together as a wired OR output to the output pin in the integrated circuit.

4. A circuit as recited in claim 1, wherein the active mode is a powered up mode of operation of the integrated circuit.

5. A circuit as recited in claim 4, wherein the primary driver circuit comprises relatively strong transistors for the powered up mode of operation, and the secondary driver circuit comprises relatively weak transistors for the power-down mode of operation of the integrated circuit.

6. A circuit as recited in claim 4, wherein the secondary driver circuit comprises a pull-up transistor and a pull-down transistor, the control logic being connected to the pull-up transistor and to the pull-down transistor for driving the output pin while the integrated circuit is in the power-down mode of operation.

7. A circuit as recited in claim 4, wherein the state of the integrated circuit is representative of a value of the output pin being driven by the primary driver circuit during the powered up mode prior to the power-down mode of operation, the control logic receiving the value of the output pin for generating the control signal relative to the state of the integrated circuit.

8. A circuit as recited in claim 4, wherein the state of the integrated circuit is representative of a current value and a last value of the output pin being driven by the primary driver circuit during the powered up mode prior to the power-down mode as the integrated circuit enters the power-down mode of operation, the control logic receiving the current and last values for generating the control signal relative to the state of the integrated circuit.

9. A circuit as recited in claim 4, wherein the state of the integrated circuit is representative of a power down indication of the integrated circuit during the powered up mode prior to the power-down mode, the control logic receiving the power down indication for generating the control signal relative to the state of the integrated circuit.

10. A circuit as recited in claim 9, wherein the secondary driver circuit comprises a pull-up transistor and a pull-down transistor, the control logic being connected to the pull-up transistor and to the pull-down transistor for driving the output pin while the integrated circuit is in the power-down mode of operation.

11. A circuit as recited in claim 10, wherein the control logic generates plural control signals for controlling each of the pull-up transistor and the pull-down transistor for driving the output pin while the integrated circuit is in the power-down mode of operation.

12. A circuit as recited in claim 11, wherein the state of the integrated circuit includes a pull up/down mode indication, the control logic generating control signals relative to the state of the integrated circuit and the mode indication to enable and disable the controlling of the pull-up transistor and the pull-down transistor for driving the output pin.

13. A circuit as recited in claim 12, wherein the state of the integrated circuit is representative of a current value and a last value of the output pin being driven by the primary driver circuit during the powered up mode prior to the power-down mode as the integrated circuit enters the power-down mode of operation, the control logic receiving the current and last values for generating the control signal relative to the state of the integrated circuit.

14. A circuit as recited in claim 13, wherein the control logic is responsive to the pull up/down mode indication for generating control signals for controlling the pull-up transistor and the pull-down transistor for driving the output pin to either of the current and last values relative to the state of the integrated circuit.

15. A circuit for holding a defined value at an output pin during power down of an integrated circuit, comprising:
    means for driving the output pin with first driver logic responsive to a state of the integrated circuit when the integrated circuit is in an active mode of operation;
    means for driving the output pin with second driver logic when the integrated circuit is in a power-down mode of operation during a phase of inactivity;
    means for generating a control signal relative to the state of the integrated circuit in response to a change in the mode of operation of the integrated circuit from the active mode to the power-down mode; and
    means coupled to receive the control signal and for selectively setting the output pin logic level with the second driver logic in response to the control signal generating means and the state of the integrated circuit while the integrated circuit is in the power-down mode of operation;
    wherein the first driver logic comprises a primary driver circuit of less current-sourcing capability to drive the output pin while the integrated circuit is in the active mode of operation; and
    the second driver logic comprises a secondary driver circuit of less current-sourcing capability than the first driver logic for selectively driving the output pin while the integrated circuit is in the power-down mode of operation.

16. A circuit as recited in claim 15, wherein the active mode is a powered up mode of operation of the integrated circuit.

17. A circuit as recited in claim 16, wherein the primary circuit comprises relatively strong transistors for the powered up mode of operation, and the secondary circuit comprises relatively weak transistors for the power-down mode of operation of the integrated circuit.

18. A method for setting a digital potential at an integrated circuit device output pin, comprising the steps of:
    driving the output pin with first driver logic responsive to a state of the integrated circuit when the integrated circuit is in an active mode of operation;
    driving the output pin with a second driver logic when the integrated circuit is in a power-down mode of operation during a phase of inactivity;
    generating a control signal relative to the state of the integrated circuit in response to a change in the mode of operation of the integrated circuit from the active mode to the power-down mode;
    receiving the control signal at the second driver logic and selectively setting the output pin logic level with the second driver logic in response to the generated control signal and the state of the integrated circuit while the integrated circuit is in the power-down mode of operation;
    wherein the first driver logic comprises a primary driver of sufficient current-sourcing capability to drive the output pin while the integrated circuit is in the active mode of operation; and
    the second driver logic comprises a secondary driver circuit of less current-sourcing capability than the first driver logic for selectively driving the output pin while the integrated circuit is in the power-down mode of operation.

19. A method as recited in claim 18, wherein the generating step generates the control signal in response to an event external to the integrated circuit device, the setting step setting the output pin logic level with the second driver logic in response to the generated control signal allowing the output pin logic level to be overwritten by external devices upon power down of the integrated circuit device.

* * * * *

UNITED STATES PATENT AND TRADEMARK OFFICE
CERTIFICATE OF CORRECTION

PATENT NO.    : 6,448,812 B1              Page 1 of 1
DATED         : September 10, 2002
INVENTOR(S)   : Tommaso Bacigalupo It is certified that error appears in the above-identified patent and that said Letters Patent is hereby corrected as shown below:

<u>Title page,</u>
Item [73], Assignee: change "Infineon Technologies North America Corp., San Jose, California" to -- Siemens Aktiengesellschaft, Munich, Germany --.

Signed and Sealed this

Nineteenth Day of August, 2003

JAMES E. ROGAN
*Director of the United States Patent and Trademark Office*